(12) United States Patent
Badrieh

(10) Patent No.: US 11,342,007 B2
(45) Date of Patent: May 24, 2022

(54) CAPACITANCE ALLOCATION BASED ON SYSTEM IMPEDANCE

(71) Applicant: Micron Technology, Inc., Boise, ID (US)

(72) Inventor: Fuad Badrieh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/989,555

(22) Filed: Aug. 10, 2020

(65) Prior Publication Data

US 2022/0044709 A1  Feb. 10, 2022

(51) Int. Cl.
| | | |
|---|---|---|
| *G11C 16/04* | (2006.01) | |
| *G11C 5/14* | (2006.01) | |
| *H01L 23/64* | (2006.01) | |
| *G11C 5/06* | (2006.01) | |

(52) U.S. Cl.
CPC ............ *G11C 5/14* (2013.01); *G11C 5/06* (2013.01); *H01L 23/642* (2013.01)

(58) Field of Classification Search
CPC ............ G11C 5/14; G11C 5/06; H01L 23/642
See application file for complete search history.

(56) References Cited

U.S. PATENT DOCUMENTS

| 10,224,087 B1 * | 3/2019 | Jung ................... G11C 13/004 |
| 10,529,407 B2 * | 1/2020 | Kim ..................... G06F 1/3287 |
| 10,796,729 B2 * | 10/2020 | Badrieh ................ G11C 5/063 |

\* cited by examiner

*Primary Examiner* — Pho M Luu
(74) *Attorney, Agent, or Firm* — Holland & Hart LLP

(57) ABSTRACT

Methods, systems, and devices for capacitance allocation based on system impedance are described. A memory device may include a first voltage rail for distributing a first supply voltage to an array of memory cells. The memory device may be coupled with a circuit using a pad of the memory device; that is, the memory device may be coupled with other circuitry within a package or board. The memory device may determine an impedance associated with the circuit, and may couple one or more capacitors with the first voltage rail based on the impedance. The memory device may include a second voltage rail for distributing a second supply voltage to the array of memory cells. The memory device may compare the performance of the first and second voltage rails and couple one or more capacitors with the first voltage rail or the second voltage rail based on the comparison.

24 Claims, 6 Drawing Sheets

CAPACITANCE ALLOCATION BASED ON SYSTEM IMPEDANCE

BACKGROUND

The following relates generally to one or more systems for memory and more specifically to capacitance allocation based on system impedance.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
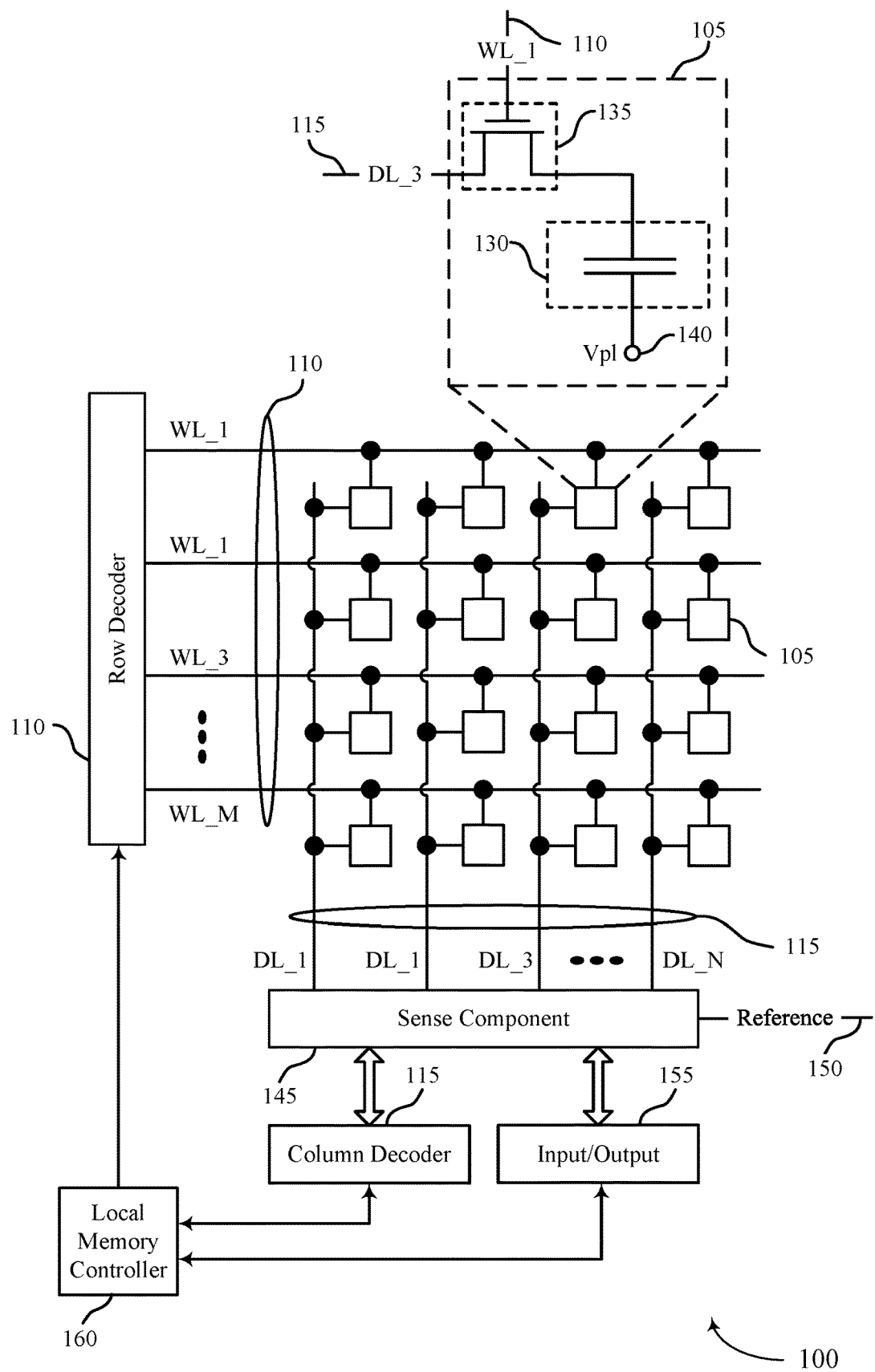
FIG. 1 illustrates an example of a memory die that supports capacitance allocation based on system impedance in accordance with examples as disclosed herein.

A memory die may include a power distribution network (PDN) to distribute power (e.g., voltages) to various components of the memory die. The PDN may receive electrical power from one or more power supplies or voltage sources and may distribute the power or voltages across the die using one or more voltage "rails" (e.g., conductive paths). Each voltage rail may distribute a particular supply voltage to the components of the memory die. For example, a memory die may include a $V_{DD}$ voltage rail for distributing a $V_{DD}$ supply voltage to the memory die, a $V_{ss}$ voltage rail for distributing a $V_{ss}$ supply voltage to the memory die, etc.

Each voltage rail may be configured to supply a single, voltage (e.g., a constant voltage or a direct current (DC) voltage) to components on the memory die. The memory die may include various features to help the voltage rail maintain this constant voltage. For example, a PDN may include capacitors coupled with the voltage rails to help the voltage rails maintain their supply voltages over a range of operating conditions and reduce (or minimize) voltage oscillations. In some cases, such capacitors may provide additional charge (e.g., voltage) to a voltage rail over short durations of high demand, and thus their inclusion may be conceptually similar to having small auxiliary power supplies distributed throughout the PDN. In some cases, the performance of a voltage rail is evaluated based on its ability to maintain a relatively constant supply voltage and compensate for variations in the voltage due to current or power demands on the voltage rail, for example. The performance of a voltage rail may be affected by the impedance of circuitry in the memory die, along with the impedance of circuits that are coupled with the memory die (such as other circuitry in a package or board, for example).

The capacitance values and locations of capacitors coupled with the voltage rails may be selected based on various characteristics of the memory die and the system in which the memory die may be used. For example, the capacitance values and/or locations may be selected based on the impedances of a circuit with which the memory die is coupled with a goal of compensating for the impedance using appropriate capacitance. Impedances may include the resistance, capacitance, or inductance of the circuitry, all of which may affect the frequency response of the circuitry and may therefore affect the capacitance used to achieve a desired performance of the voltage rails. In some cases, the capacitance values of capacitors coupled with the voltage rails may be selected based on simulated or projected impedances of the memory die, the package, or the board. Each physical memory die, package, and board, however, may have slightly different impedances due to, for example, process variations that may occur during fabrication. Thus, capacitance values or locations selected during a design phase may be more effective in some systems than others.

To address the effect of such variations, a memory die may be configured to tailor the capacitance of the voltage rails based on identifying (e.g., measuring, determining) the impedances of the specific system in which the memory die is used. For example, a memory die may identify the impedances of the system and couple one or more capacitors with one or more voltage rails based on the identified impedances. In some cases, a memory die may identify the impedances of the system after the memory die is physically installed in the system rather than based on simulations or projections.

Features of the disclosure are initially described in the context of dies and circuits as described with reference to FIGS. 1 and 2. Features of the disclosure are described in the context of systems and additional circuits as described with reference to FIGS. 3A, 3B, and 4. These and other features of the disclosure are further illustrated by and described with reference to an apparatus diagram and a flowchart that relate to capacitance allocation based on system impedance as described with reference to FIGS. 5 and 6.

FIG. 1 illustrates an example of a memory die 100 that supports capacitance allocation based on system impedance in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

A memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135. The capacitor 130 may be an example of a dielectric capacitor or a ferroelectric capacitor. A node of the capacitor 130 may be coupled with a voltage source 140, which may be the cell plate reference voltage, such as $V_{pl}$, or may be ground, such as $V_{ss}$.

The memory die 100 may include one or more access lines (e.g., one or more word lines 110 and one or more digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding or operation. Memory cells 105 may be positioned at intersections of the word lines 110 and the digit lines 115.

Operations such as reading and writing may be performed on the memory cells 105 by activating or selecting access lines such as one or more of a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in either a two-dimensional or three-dimensional configuration may be referred to as an address of a memory cell 105.

Accessing the memory cells 105 may be controlled through a row decoder 120 or a column decoder 125. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory die 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more of commands or data from one or more different memory controllers (such as an external controller associated with a host device) translate the commands or the data (or both) into information that can be used by the memory die 100, perform one or more operations on the memory die 100, and communicate data from the memory die 100 to the host device based on performing the one or more operations. The local memory controller 160 may generate row signals and column address signals to activate the target word line 110 and the target digit line 115. The local memory controller 160 may also generate and control various voltages or currents used during the operation of the memory die 100. In general, the amplitude, the shape, or the duration of an applied voltage or current discussed herein may be varied and may be different for the various operations discussed in operating the memory die 100.

The local memory controller 160 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory die 100 that are not directly related to accessing the memory cells 105.

In some examples, the memory die 100 may be configured to tailor the capacitance of the voltage rails based on identifying (e.g., measuring, determining) the impedances of the specific system in which the memory die 100 is used. For example, a memory die 100 may identify the impedances of the system and couple one or more capacitors with one or more voltage rails based on the identified impedances. In some cases, a memory die 100 may identify the impedances of the system after the memory die is physically installed in the system rather than based on simulations or projections.

Figure 2:
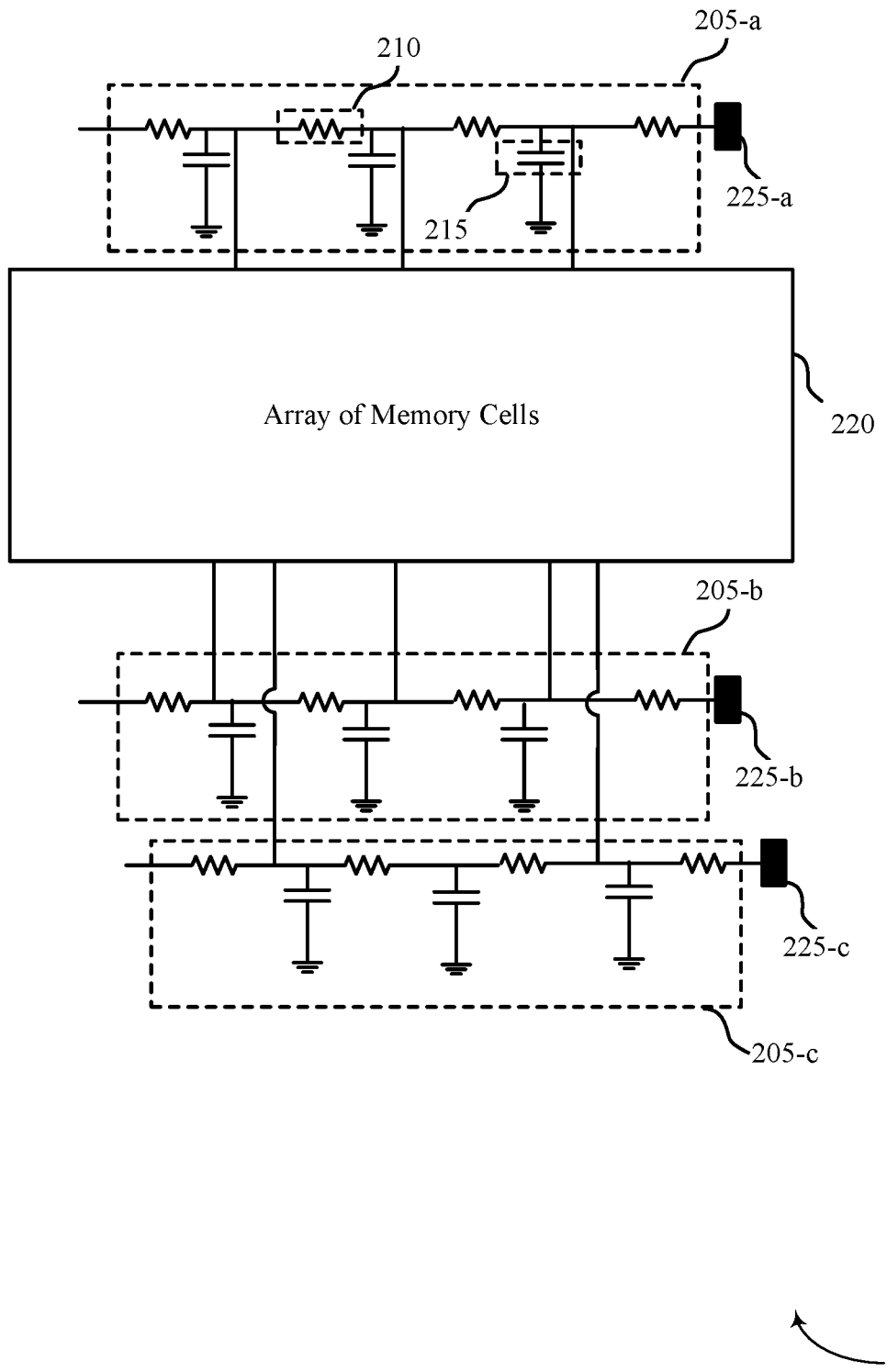
FIG. 2 illustrates an example of a circuit that supports capacitance allocation based on system impedance in accordance with examples as disclosed herein.

FIG. 2 illustrates an example of a circuit 200 that supports dynamic allocation of a capacitive component in a memory device in accordance with examples as disclosed herein. Circuit 200 may be included in a memory die, such as memory die 100 described with reference to FIG. 1. Circuit 200 includes an array of memory cells 220 that may be included in a memory die such as memory die 100, for example.

Circuit 200 may include three voltage rails 205, each of which may include resistive elements 210 and (optionally) capacitors 215 connected in a grid. Each voltage rail 205 may be coupled with a corresponding supply voltage source via, for example, pad 225 (which may provide electrical access to the voltage rail from off the die or off the memory device) or via a direct electrical connection, using an on-die voltage source. A supply voltage source may be a voltage regulator or power supply, for example, and may be configured to supply (e.g., apply) a substantially constant supply voltage to voltage rail 205. Voltage rails 205 may be configured to distribute (e.g., transfer) the supply voltage applied by a voltage source to (e.g., across) the array of memory cells 220 and/or to other portions of a memory device using the resistive grid, for example. In some cases, a pad 225 of circuit 200 may be coupled with a $V_{DD}$ voltage source, a $V_{ss}$ voltage source, a $V_{cc}$ voltage source, a $V_{PP}$ voltage source, or another supply voltage source. Such supply voltage sources may provide power to the array of memory cells 220 and/or to other components in a memory device during operation of the memory device.

In some cases, a supply voltage may be provided to a voltage rail 205 via a pad 225. Each pad 225 may receive a different supply voltage for the corresponding voltage rail 205. For example, pad 225-a may receive a $V_{ss}$ voltage for voltage rail 205-a, pad 225-b may receive a $V_{DD}$ voltage for voltage rail 205-b, and/or pad 225-c may receive a $V_{cc}$ voltage for voltage rail 205-c. In some cases, two voltage rails 205 may be coupled with the same voltage source, or two voltage sources may supply the same voltage to two corresponding voltage rails 205. That is, the voltage rails 205 may be used to distribute the same or different voltages to the array of memory cells 220 and/or to other portions of a memory die.

In some cases, a voltage of voltage rail 205 may vary along voltage rail 205; that is, the voltage at one location on voltage rail 205 may be different than the voltage at another location on voltage rail 205. For example, the voltage of voltage rail 205 at a location far away from voltage source may be lower than the voltage of voltage rail 205 nearer to voltage source due to current or voltage demand from various components coupled with voltage rail 205 (such as memory cells in the array of memory cells 220), or due to parasitic capacitance along voltage rail 205. Thus, voltage rail 205 may be considered as having various current sources connected to voltage rail 205, with each current source representing a component (or multiple components) that demands current from voltage rail 205.

A voltage rail 205 may include capacitors 215 along voltage rail 205 to help compensate for such voltage variations by supplying additional voltage or charge to the voltage rail 205. Such capacitors 215 may be hardwired to voltage rail 205 and serve as distributed charge suppliers that may supply additional charge to meet current demand along voltage rail 205, thereby avoiding propagating such demand back to the voltage source, which may cause a larger voltage droop on the rail.

As described with reference to FIGS. 3A and 3B, in some cases a memory die may include capacitors that may be selectively coupled with one or more voltage rails (such as voltage rail 205) to tailor the capacitance of the voltage rails to the particular system (e.g., package, board) in which the memory die 305 resides.

Figure 3A:
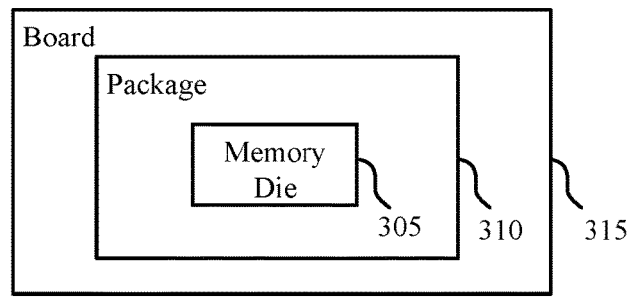
FIG. 3A illustrates an example of a system that supports capacitance allocation based on system impedance in accordance with examples as disclosed herein.

FIG. 3A illustrates an example of a system 300-a that supports capacitance allocation based on system impedance in accordance with examples as disclosed herein. The system 300-a may include a memory die 305, which may be an example of memory die 100, for example.

Memory die 305 may be included in a package 310. In some examples, package 310 may encapsulate memory die 305 (and possibly additional circuitry or dice) in a physical case. Package 310 may include external electrical contacts (such as balls) that may be used to couple pads of memory die 305 to other circuitry that is external to package 310. Such circuitry may include one or more electrical components that are in electrical communication with (e.g., connected with) the memory die 305, such as components that include logic circuitry, analog circuitry, power supply circuitry, or other types of circuitry, for example.

Memory die 305 and/or package 310 may be included in a board 315. Board 315 may be a printed circuit board (PCB) or another type of board that electrically connects the external electrical contacts of package 310 with other circuitry on board 315, such as other electronic components, power supply components, packages, or dice, for example. The other circuitry on board 315 may be in electrical communication with memory die 305.

Figure 3B:
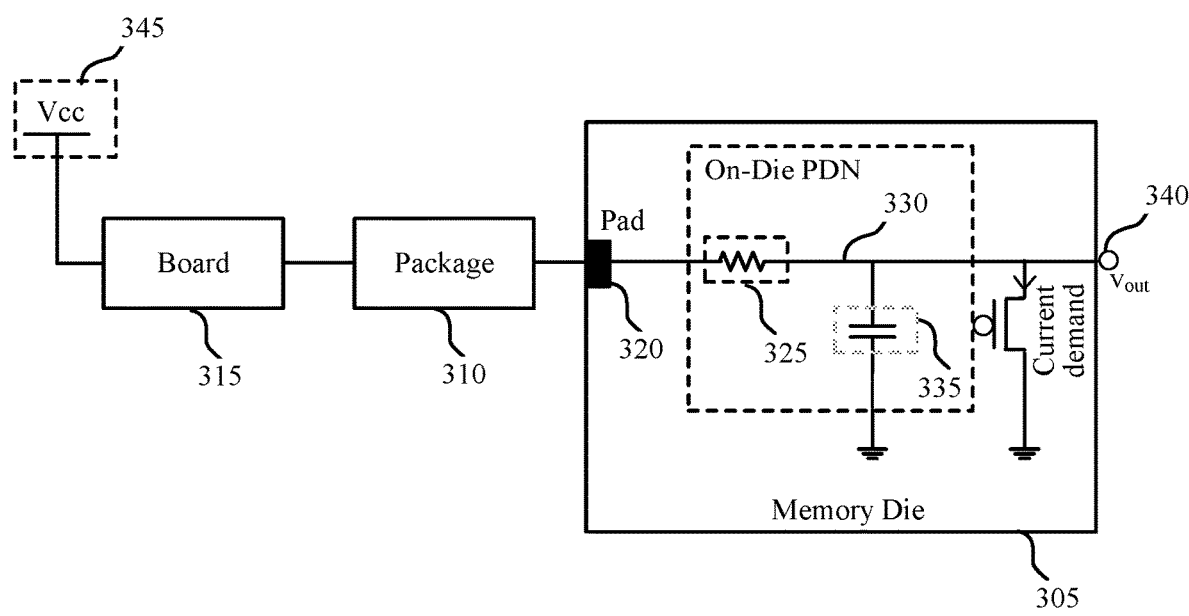
FIG. 3B illustrates an example of a system that supports capacitance allocation based on system impedance in accordance with examples as disclosed herein.

FIG. 3B illustrates an example of a system 300-a that supports capacitance allocation based on system impedance in accordance with examples as disclosed herein. The system 300-b may include memory die 305, package 310, and board 315. In FIG. 3B, the locations of memory die 305, package 310, and board 315 and other elements of system 300-b are arranged to illustrate the downstream effect, on memory die 305, of the impedances of board 315 and package 310 rather than to show relative physical locations. In particular, the impedances of board 315 and package 310 may affect the frequency behavior of supply voltages provided to memory die 305, which may in turn affect the corresponding performance of a corresponding voltage rail in memory die 305.

For example, board 315 may be coupled with a voltage source 345 that may supply (for example) a $V_{cc}$ supply voltage to board 315. Board 315 may, in turn, provide the $V_{cc}$ voltage to package 310, which may be mounted on board 315. Package 310 may provide the $V_{cc}$ voltage to a pad 320 of memory die 305. Memory die 305 may use a voltage rail 330 of an on-die PDN to distribute the $V_{cc}$ voltage to one or more memory arrays on memory die 305, as described with reference to FIG. 2. Voltage rail 330 may be associated with resistance 325 and capacitance 335, which may represent a total resistance and capacitance associated with voltage rail 330 due to physical resistors and capacitors, along with parasitic resistance and capacitance. The impedance seen at (e.g., detected at, measured at, identified at) pad 320 may include resistance, capacitance, and inductance of circuits coupled with pad 320 (such as other circuitry in package 310 and board 315) as well as resistance 325, capacitance 335, and any inductance associated with voltage rail 330.

The $V_{cc}$ voltage may be, nominally, a DC voltage (such as 3.0 volts, 5.0 volts, or another voltage). However, the $V_{cc}$ voltage actually received by memory die 305 at pad 320 may be affected by the impedances of board 315 and package 310. Thus, the performance of the $V_{cc}$ voltage rail 330 (e.g., its ability to maintain a constant voltage and reduce (or minimize) oscillations or droops) in the on-die PDN may also be affected by the impedances of board 315 and package 310, along with the impedance introduced by resistance 325 and capacitance 335. As previously discussed, the capacitance value or physical location of capacitance 335 may be selected, during a design phase, to counteract the projected or simulated impedance introduced by board 315 and package 310. In practice, however, the impedances of board 315 and package 310 may vary from the values predicted during simulation due to, for example, process variations or other effects.

To compensate for such variations, a memory die 305 may identify (e.g., measure, calculate, estimate) an impedance associated with a circuit (e.g., some or all of the circuitry of board 315, package 310, or both board 315 and package 310) that is coupled with pad 320, and change the capacitance 335 associated with voltage rail 330 based on the identified impedance. That is, memory die 305 may identify, at pad 320 of memory die 305, an impedance associated with a circuit coupled with memory die 305. Memory die 305 may change the capacitance 335 by coupling or uncoupling one or more capacitors with voltage rail 330, for example, as described in more detail with reference to FIG. 4. In some examples, memory die 305 may select one or more capacitors based on the identified impedance and couple the one or more capacitors with voltage rail 330 to change the capacitance 335. Memory die 305 may select the capacitors based on their capacitance, based on their physical location on the die, or both.

Memory die 305 (e.g., a controller of memory die 305, such as local memory controller 160) may identify an impedance of the circuit using a variety of techniques. For example, memory die 305 may, while (e.g., over a duration in which) voltage rail 330 is distributing a supply voltage to an array of memory cells of memory die 305, perform a test procedure to execute various memory access operations (such as reads or writes) on the array of memory cells, and measure the resulting current demand and output voltage $v_{out}$ at a node 340 that is coupled with voltage rail 330. Node 340 may be coupled with pad 320 either directly or through resistance 325. Memory die 305 may calculate the impedance based on the measured current demand and measured output voltage $v_{out}$ at node 340. In some examples, memory die 305 may identify the impedance by determining the current demand, voltage Vout, or both at node 340 as a function of time, as a function of frequency, or both.

In some examples, memory die 305 may identify the impedance by comparing the performance of a first voltage rail (such as voltage rail 330) with the performance of a second voltage rail that is configured to distribute a second supply voltage to the array of memory cells. For example, memory die 305 may, while the first and second voltage rails are distributing respective supply voltages to the array of memory cells, apply a current demand to the memory die (e.g., by performing operations on the memory die that demand current) and determine a die voltage and die current for the memory die 305, such as a voltage and current for each of the first and second voltage rails. Memory die 305 may compare the performance of the first voltage rail with the performance of the second voltage rail to determine how to allocate capacitance to each of the voltage rails. For example, memory die 305 may identify one or more capacitors to couple with the first voltage rail or second voltage rail based on the comparison of the performance of the first and second voltage rails. In this manner, the memory die 305 may tailor the capacitance coupled with each of the voltage rails based on the relative performance of the voltage rails within the system.

In some examples, a memory die 305 may decouple a capacitor from the first voltage rail and couple the capacitor with the second voltage rail based on the comparison of the performance of the first and second voltage rails.

Figure 4:
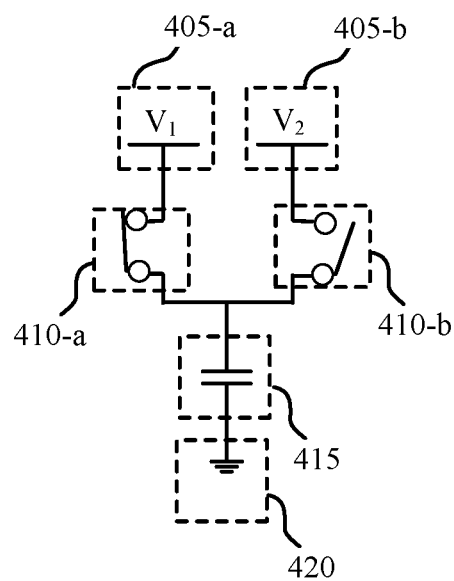
FIG. 4 illustrates an example of a circuit that supports capacitance allocation based on system impedance in accordance with examples as disclosed herein.

FIG. 4 illustrates an example of a circuit 400 that supports capacitance allocation based on system impedance in accordance with examples as disclosed herein. Circuit 400 may represent a portion of a memory die, such as memory die 100, for example.

In some examples, a memory die may include one or more capacitors that may be selectively coupled with (e.g., allocated to) a first voltage rail or a second voltage rail based on the impedances of a circuit coupled with the memory die. For example, memory die 305 may couple some or all of the capacitors with the first voltage rail or the second voltage rail based on the impedances of the circuit, such that the capacitance is allocated to the voltage rails based on the overall impedance of the system and the relative performance of each of the voltage rails. Circuit 400 may depict an example of circuitry for selectively coupling one or more capacitors with a first voltage rail or a second voltage rail.

Circuit 400 includes a first voltage rail 405-a that is configured to distribute a first supply voltage (e.g., V1) to a memory array. Circuit 400 includes a second voltage rail 405-b that configured to distribute a second supply voltage (e.g., V2) to a memory array.

Circuit 400 includes one or more capacitors 415. Each capacitor 415 may be associated with a capacitance value and a physical location on the memory die. Capacitor 415 may be grounded; that is, one plate of capacitor 415 may be coupled with a ground node 420. Another plate of capacitor 415 may be selectively coupled with voltage rail 405-a or voltage rail 405-b by activating switch 410-a or switch 410-b, respectively.

In some examples, switch 410 may be implemented using (e.g., may include) reversible switches, such as transistors, for example. In some examples, switch 410 may be implemented using non-reversible switches, such as fuses or anti-fuses, for example, or using switched fuses. In some examples, a fuse may refer to a fuse that breaks a conductive path when a threshold is satisfied or an anti-fuse that creates a conductive path when a threshold is satisfied.

In some examples, capacitor 415 may be coupled with voltage rail 405-a or with voltage rail 405-b, but not with both voltage rails 405-a, 405-b. That is, switch 410-a may be activated (as shown in FIG. 4), or switch 410-a may be activated, but switches 410-a and 410-b may not be activated at the same time. In some examples, switch 410-a and switch 410-b may be activated at the same time.

Figure 5:
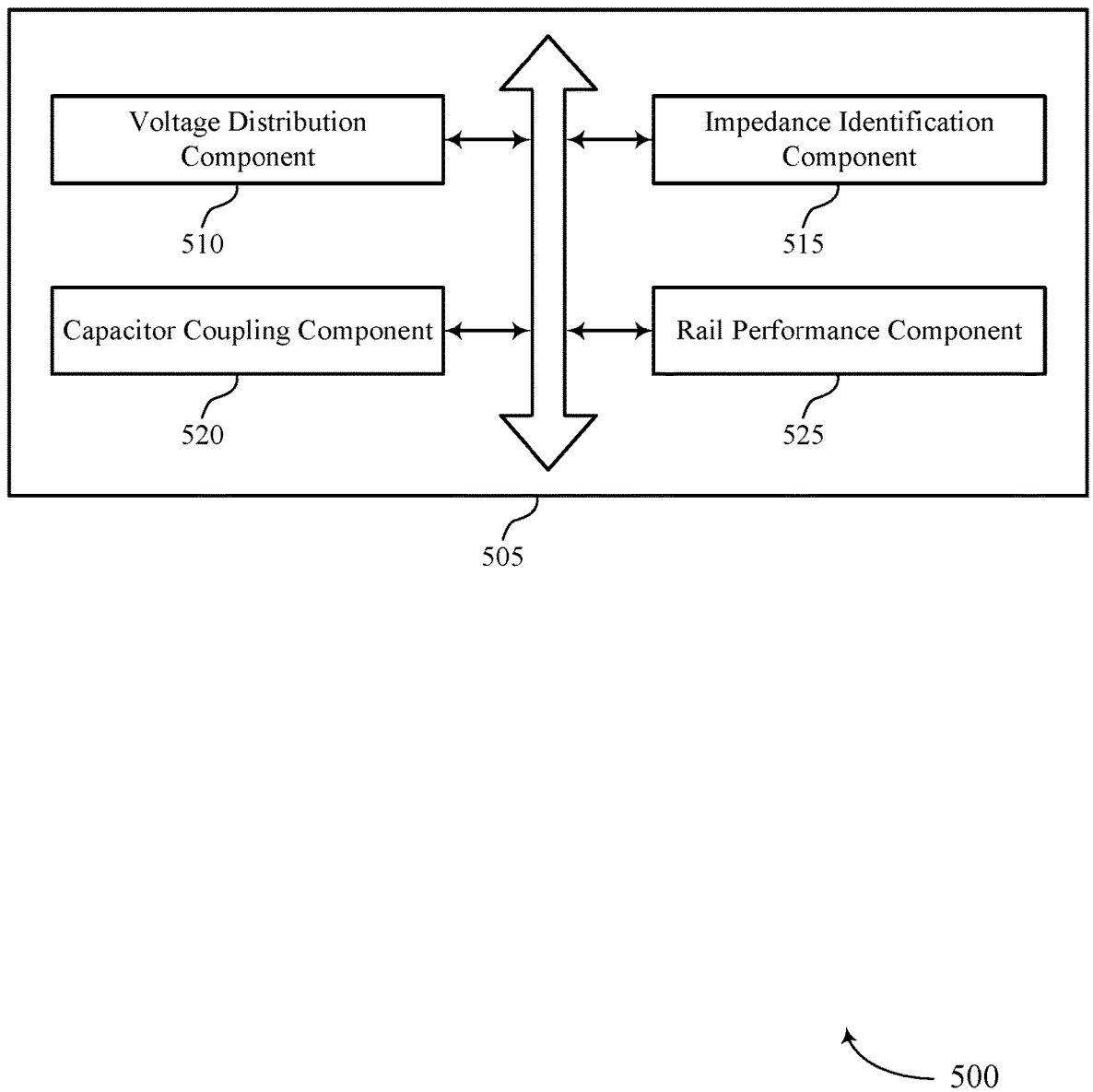
FIG. 5 shows a block diagram of a memory device that supports capacitance allocation based on system impedance in accordance with examples as disclosed herein.

FIG. 5 shows a block diagram 500 of a memory device 505 that supports capacitance allocation based on system impedance in accordance with examples as disclosed herein. The memory device 505 may be an example of aspects of a memory die or memory device as described with reference to FIGS. 1 through 4. The memory device 505 may include a voltage distribution component 510, an impedance identification component 515, a capacitor coupling component 520, and a rail performance component 525. Each of these modules may communicate, directly or indirectly, with one another (e.g., via one or more buses).

The voltage distribution component 510 may distribute, using a first voltage rail, a first voltage to an array of memory cells on a memory die that is coupled with a circuit using a pad. In some examples, the voltage distribution component 510 may distribute the first voltage to the array of memory cells after coupling the first voltage rail with the one or more capacitors.

The impedance identification component 515 may identify, at a pad of the memory die, an impedance associated with the circuit over a duration when the first voltage rail is distributing the first voltage to the array of memory cells. In some cases, the circuit includes one or more components in electrical communication with the memory die. In some examples, the impedance identification component 515 may compare a performance of the first voltage rail with a performance of a second voltage rail of the memory die, where the second voltage rail is configured to distribute a second voltage to the array of memory cells.

The capacitor coupling component 520 may couple one or more capacitors with the first voltage rail based on identifying the impedance of the circuit. In some examples, the capacitor coupling component 520 may identify the one or more capacitors based on the comparison of the performance of the first voltage rail with the performance of the second voltage rail, where coupling the one or more capacitors with the first voltage rail is based on identifying the one or more capacitors.

In some examples, the capacitor coupling component 520 may decouple a first capacitor of the one or more capacitors from the second voltage rail based on the comparison, where the first capacitor is coupled with the second voltage rail during at least a portion of the duration, and where coupling the one or more capacitors includes coupling the first capacitive component with the first voltage rail after decoupling the first capacitive component from the second voltage rail. In some examples, the capacitor coupling component 520 may activate one or more switches to couple the one or more capacitors with the first voltage rail. In some examples, activating the one or more switches includes setting one or more fuses or anti-fuses.

The rail performance component 525 may identify the performance of the first voltage rail and the second voltage rail by applying a current demand to the memory die and determining a die current and a die voltage based on applying the current demand, where the impedance is determined based on the determining the die current and determining the die voltage.

In some examples, the rail performance component 525 may identify the performance of the first voltage rail and the performance of the second voltage rail using a frequency-domain analysis, a time-domain analysis, or a combination thereof, where comparing the performance of the first voltage rail and the performance of the second voltage rail is based on the identifying.

Figure 6:
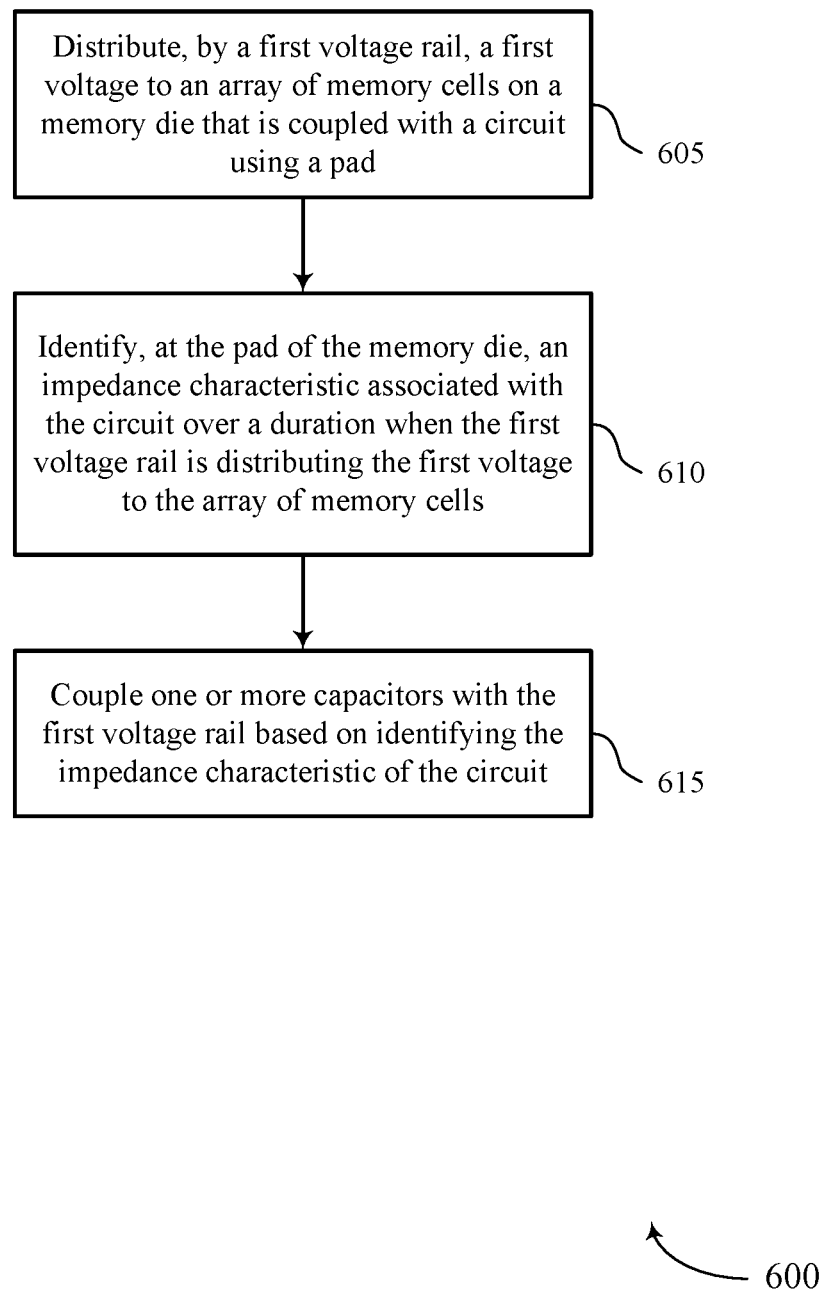
FIG. 6 shows a flowchart illustrating a method or methods that support capacitance allocation based on system impedance in accordance with examples as disclosed herein.

FIG. 6 shows a flowchart illustrating a method or methods 600 that supports capacitance allocation based on system impedance in accordance with examples as disclosed herein. The operations of method 600 may be implemented by a memory die or memory device or its components as described herein. For example, the operations of method 600 may be performed by a memory die or memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may distribute, using a first voltage rail, a first voltage to an array of memory cells on a memory die that is coupled with a circuit using a pad. The operations of 605 may be performed according to the methods described herein. In some examples, aspects of the operations of 605 may be performed by a voltage distribution component as described with reference to FIG. 5.

At 610, the memory device may identify, at the pad of the memory die, an impedance associated with the circuit over a duration when the first voltage rail is distributing the first voltage to the array of memory cells. The operations of 610 may be performed according to the methods described herein. In some examples, aspects of the operations of 610 may be performed by an impedance identification component as described with reference to FIG. 5.

At 615, the memory device may couple one or more capacitors with the first voltage rail based on identifying the impedance of the circuit. The operations of 615 may be performed according to the methods described herein. In some examples, aspects of the operations of 615 may be performed by a capacitor coupling component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for distributing, by a first voltage rail, a first voltage to an array of memory cells on a memory die that is coupled with a circuit using a pad, identifying, at the pad of the memory die, an impedance associated with the circuit over a duration when the first voltage rail is distributing the first voltage to the array of memory cells, and coupling one or more capacitors with the first voltage rail based on identifying the impedance of the circuit.

In some examples of the method 600 and the apparatus described herein, identifying the impedance may include operations, features, means, or instructions for comparing a performance of the first voltage rail with a performance of a second voltage rail of the memory die, where the second voltage rail may be configured to distribute a second voltage to the array of memory cells, and identifying the one or more capacitors based on the comparison, where coupling the one or more capacitors with the first voltage rail may be based on identifying the one or more capacitors.

Some examples of the method 600 and the apparatus described herein may further include operations, features, means, or instructions for identifying the performance of the first voltage rail and the second voltage rail by applying a current demand to the memory die and determining a die current and a die voltage based on applying the current demand, where the impedance may be determined based on the determining the die current and determining the die voltage.

Some examples of the method 600 and the apparatus described herein may further include operations, features, means, or instructions for identifying the performance of the first voltage rail and the performance of the second voltage rail using a frequency-domain analysis, a time-domain analysis, or a combination thereof, where comparing the performance of the first voltage rail and the performance of the second voltage rail may be based on the identifying.

Some examples of the method 600 and the apparatus described herein may further include operations, features, means, or instructions for decoupling a first capacitor of the one or more capacitors from the second voltage rail based on the comparison, where the first capacitor may be coupled with the second voltage rail during at least a portion of the duration, and where coupling the one or more capacitors includes coupling the first capacitive component with the first voltage rail after decoupling the first capacitive component from the second voltage rail.

In some examples of the method 600 and the apparatus described herein, coupling the one or more capacitors with the first voltage rail may include operations, features, means, or instructions for activating one or more switches to couple the one or more capacitors with the first voltage rail.

In some examples of the method 600 and the apparatus described herein, coupling the one or more capacitors with the first voltage rail may include operations, features, means, or instructions for setting one or more fuses or anti-fuses.

In some examples of the method 600 and the apparatus described herein, the circuit includes one or more components in electrical communication with the memory die.

Some examples of the method 600 and the apparatus described herein may further include operations, features, means, or instructions for distributing, by the first voltage rail after coupling the first voltage rail with the one or more capacitors, the first voltage to the array of memory cells.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells on a memory die that is coupled with a circuit using a pad, a first voltage rail coupled with the array of memory cells and configured to distribute a first voltage to the array of memory cells, a second voltage rail coupled with the array of memory cells and configured to distribute a second voltage to the array of memory cells, one or more capacitors selectively couplable with the first voltage rail and the second voltage rail, a controller configured to identify an impedance associated with the circuit, and one or more switch s configured to couple the one or more capacitors with the first voltage rail or the second voltage rail or both based on the impedance.

In some examples, the one or more switches includes one or more transistors configured to couple the one or more capacitors with the first voltage rail or the second voltage rail.

In some examples, the one or more switches includes one or more fuses configured to couple the one or more capacitors with the first voltage rail or the second voltage rail based on setting the one or more fuses.

In some examples, the controller may be configured to set the one or more fuses based on identifying the impedance.

In some examples, the circuit and the memory die may be included in a circuit board. In some examples, the circuit and the memory die may be contained in a single package.

An apparatus is described. The apparatus may include an array of memory cells on a memory die that is coupled with a circuit using a pad and a controller coupled with the array of memory cells and operable to cause the memory device to distribute, by a first voltage rail, a first voltage to the array of memory cells, identify, at the pad of the memory die, an impedance associated with the circuit over a duration when the first voltage rail is distributing the first voltage to the array of memory cells, and couple one or more capacitors with the first voltage rail based on identifying the impedance of the circuit.

Some examples may further include comparing a performance of the first voltage rail with a performance of a second voltage rail of the memory die, where the second voltage rail may be configured to distribute a second voltage to the array of memory cells, and identify the one or more capacitors based on the comparison, where coupling the one or more capacitors with the first voltage rail may be based on identifying the one or more capacitors.

Some examples may further include identifying the performance of the first voltage rail and the performance of the second voltage rail by applying a current demand to the memory die and determining a die current and a die voltage based on applying the current demand, where the impedance may be determined based on the determining the die current and determining the die voltage.

Some examples may further include identifying the performance of the first voltage rail and the performance of the second voltage rail using a frequency-domain analysis or a time-domain analysis, where comparing the performance of the first voltage rail and the performance of the second voltage rail may be based on the identifying.

Some examples may further include decoupling a first capacitive component of the one or more capacitors from the second voltage rail based on the comparison, where the first capacitive component may be coupled with the second voltage rail during at least a portion when the performance of the first voltage rail and the performance of the second voltage rail may be identified, where coupling the one or more capacitors includes coupling the first capacitive component with the first voltage rail after decoupling the first capacitive component from the second voltage rail.

Some examples may further include activating one or more switches to couple one or more capacitors with the first voltage rail. Some examples may further include setting one or more fuses to couple one or more capacitors with the first voltage rail.

In some examples, the circuit includes one or more components in electrical communication with the memory die.

Some examples may further include distributing, by the first voltage rail after coupling the first voltage rail with the one or more capacitors, the first voltage to the array of memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switch as discussed herein may be an example of a fuse that may be set (e.g., "blown") to electrically isolated two electrical elements or components or an anti-fuse that may be set (e.g., "blown") to electrically couple two electrical elements or components, such as a capacitor and a voltage rail.

A switch or a transistor as discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
distributing, by a first voltage rail, a first voltage to an array of memory cells on a memory die that is coupled with a circuit using a pad;
applying a current demand to the array of memory cells during a duration that the first voltage rail is distributing the first voltage to the array of memory cells;
identifying, at the pad of the memory die and based at least in part on applying the current demand, an impedance associated with the circuit over the duration that the first voltage rail is distributing the first voltage to the array of memory cells; and
coupling one or more capacitors with the first voltage rail based at least in part on identifying the impedance of the circuit.

2. The method of claim 1, wherein identifying the impedance comprises:
comparing a performance of the first voltage rail with a performance of a second voltage rail of the memory die, wherein the second voltage rail is configured to distribute a second voltage to the array of memory cells; and
identifying the one or more capacitors based at least in part on the comparison, wherein coupling the one or more capacitors with the first voltage rail is based at least in part on identifying the one or more capacitors.

3. The method of claim 2, further comprising:
identifying the performance of the first voltage rail and the second voltage rail by determining a die current and a die voltage based at least in part on applying the current demand, wherein the impedance is determined based at least in part on determining the die current and determining the die voltage.

4. The method of claim 2, further comprising:
identifying the performance of the first voltage rail and the performance of the second voltage rail using a frequency-domain analysis, a time-domain analysis, or a combination thereof, wherein comparing the performance of the first voltage rail and the performance of the second voltage rail is based at least in part on identifying the performance of the first voltage rail and the performance of the second voltage rail.

5. The method of claim 2, further comprising:
decoupling a first capacitive component of the one or more capacitors from the second voltage rail based at least in part on the comparison, wherein the first capacitive component is coupled with the second voltage rail during at least a portion of the duration, wherein coupling the one or more capacitors comprises coupling the first capacitive component with the first voltage rail after decoupling the first capacitive component from the second voltage rail.

6. The method of claim 1, wherein coupling the one or more capacitors with the first voltage rail comprises:
activating one or more switches to couple the one or more capacitors with the first voltage rail.

7. The method of claim 1, wherein coupling the one or more capacitors with the first voltage rail comprises:
setting one or more fuses to couple the one or more capacitors with the first voltage rail.

8. The method of claim 1, wherein the circuit comprises one or more components in electrical communication with the memory die.

9. The method of claim 1, further comprising:
distributing, by the first voltage rail after coupling the first voltage rail with the one or more capacitors, the first voltage to the array of memory cells.

10. An apparatus, comprising:
an array of memory cells on a memory die that is coupled with a circuit using a pad;
a first voltage rail coupled with the array of memory cells and configured to distribute a first voltage to the array of memory cells;
a second voltage rail coupled with the array of memory cells and configured to distribute a second voltage to the array of memory cells;
one or more capacitors selectively couplable with the first voltage rail and the second voltage rail;
a controller configured to:
apply a current demand to the array of memory cells during a distribution of the first voltage and the second voltage, and
identify an impedance associated with the circuit based at least in part on applying the current demand; and
one or more switches configured to couple the one or more capacitors with the first voltage rail or the second voltage rail or both based at least in part on the impedance.

11. The apparatus of claim 10, wherein the one or more switches comprises one or more transistors configured to couple the one or more capacitors with the first voltage rail or the second voltage rail.

12. The apparatus of claim 10, wherein the one or more switches comprises one or more fuses configured to couple the one or more capacitors with the first voltage rail or the second voltage rail based at least in part on setting the one or more fuses.

13. The apparatus of claim 12, wherein the controller is configured to set the one or more fuses based at least in part on identifying the impedance.

14. The apparatus of claim 12, wherein the circuit and the memory die are included in a circuit board.

15. The apparatus of claim 12, wherein the circuit and the memory die are contained in a single package.

16. An apparatus, comprising:
an array of memory cells on a memory die that is coupled with a circuit using a pad; and
a controller coupled with the array of memory cells and operable to cause the apparatus to:
distribute, by a first voltage rail, a first voltage to the array of memory cells;
apply a current demand to the array of memory cells during a duration that the first voltage rail is distributing the first voltage to the array of memory cells;
identify, at the pad of the memory die and based at least in part on applying the current demand, an impedance associated with the circuit over the duration when that the first voltage rail is distributing the first voltage to the array of memory cells; and
couple one or more capacitors with the first voltage rail based at least in part on identifying the impedance of the circuit.

17. The apparatus of claim 16, wherein the controller is operable to cause the apparatus to identify the impedance by causing the apparatus to:
compare a performance of the first voltage rail with a performance of a second voltage rail of the memory die, wherein the second voltage rail is configured to distribute a second voltage to the array of memory cells; and
identify the one or more capacitors based at least in part on the comparison, wherein coupling the one or more capacitors with the first voltage rail is based at least in part on identifying the one or more capacitors.

18. The apparatus of claim 17, wherein the controller is further operable to cause the apparatus to:
identifying the performance of the first voltage rail and the performance of the second voltage rail by determining a die current and a die voltage based at least in part on applying the current demand, wherein the impedance is determined based at least in part on determining the die current and determining the die voltage.

19. The apparatus of claim 17, wherein the controller is further operable to cause the apparatus to:
identify the performance of the first voltage rail and the performance of the second voltage rail using a frequency-domain analysis or a time-domain analysis, wherein comparing the performance of the first voltage rail and the performance of the second voltage rail is based at least in part on identifying the performance of the first voltage rail and the performance of the second voltage rail.

20. The apparatus of claim 17, wherein the controller is further operable to cause the apparatus to:
decouple a first capacitive component of the one or more capacitors from the second voltage rail based at least in part on the comparison, wherein the first capacitive component is coupled with the second voltage rail during at least a portion that the performance of the first voltage rail and the performance of the second voltage rail is identified, wherein coupling the one or more capacitors comprises coupling the first capacitive component with the first voltage rail after decoupling the first capacitive component from the second voltage rail.

21. The apparatus of claim 16, wherein the controller is operable to cause the apparatus to couple the one or more capacitors with the first voltage rail by causing the apparatus to:
activate one or more switches to couple the one or more capacitors with the first voltage rail.

22. The apparatus of claim 16, wherein the controller is operable to cause the apparatus to couple the one or more capacitors with the first voltage rail by causing the apparatus to:
set one or more fuses to couple the one or more capacitors with the first voltage rail.

23. The apparatus of claim 16, wherein the circuit comprises one or more components in electrical communication with the memory die.

24. The apparatus of claim 16, wherein the controller is operable to cause the apparatus to:
distribute, by the first voltage rail after coupling the first voltage rail with the one or more capacitors, the first voltage to the array of memory cells.

* * * * *